US007834667B1

(12) United States Patent
Wong (10) Patent No.: US 7,834,667 B1
(45) Date of Patent: Nov. 16, 2010

(54) PRECHARGE AND DISCHARGE OF I/O OUTPUT DRIVER

(75) Inventor: Myron Wai Wong, Fremont, CA (US)

(73) Assignee: Altera Corporation, San Jose, CA (US)

(*) Notice: Subject to any disclaimer, the term of this patent is extended or adjusted under 35 U.S.C. 154(b) by 0 days.

(21) Appl. No.: 11/410,674

(22) Filed: Apr. 24, 2006

(51) Int. Cl.
*H03B 1/00* (2006.01)
*H03K 3/00* (2006.01)

(52) U.S. Cl. .................... 327/108; 327/112; 326/26; 326/87

(58) Field of Classification Search .................. 327/108, 327/112, 333, 109–111; 326/82–87, 26, 326/27, 112
See application file for complete search history.

(56) References Cited

U.S. PATENT DOCUMENTS

| 4,829,199 | A | * | 5/1989 | Prater | 326/27 |
| 5,319,258 | A | * | 6/1994 | Ruetz | 326/21 |
| 6,377,089 | B1 | * | 4/2002 | Loughmiller | 327/112 |
| 7,215,144 | B2 | * | 5/2007 | Mitby et al. | 326/82 |
| 2006/0061395 | A1 | * | 3/2006 | Noto et al. | 327/108 |
| 2006/0071697 | A1 | * | 4/2006 | Mels | 327/175 |

* cited by examiner

*Primary Examiner*—Lincoln Donovan
*Assistant Examiner*—Diana J Cheng
(74) *Attorney, Agent, or Firm*—Ropes & Gray LLP (57) ABSTRACT

A buffer circuit is disclosed. In one embodiment, the buffer circuit includes a preconditioning circuit and a driver circuit. The preconditioning circuit generates a pre-charge signal in response to receiving an input signal. After a predetermined duration, or when the pre-charge circuit reaches a threshold output signal level, the input signal is coupled to an input of the driver circuit. The output signal of the driver circuit is combined with the output signal of the preconditioning circuit to form a composite output signal of the buffer circuit. In one embodiment, the pre-charge signal is used to lower the effective VDS across the transistors of the driver circuit to reduce hot-carrier injection, and therefore reduce transistor performance degradation.

26 Claims, 9 Drawing Sheets

PRECHARGE AND DISCHARGE OF I/O OUTPUT DRIVER

BACKGROUND

The present invention relates to output driver circuits, and more particularly, to techniques and circuits for pre-charging and discharging an output driver circuit.

Generally, interface circuitry such output buffer circuits are used to amplify and/or condition signals for transmission. An output buffer circuit is typically required to drive an output signal at the appropriate levels for a given transmission link or input and output (I/O) standards so that the output signal may be used by other connected circuits.

Buffer circuits are often designed to operate over a specific operating voltage and current range. For example, many driver circuits are designed to operate within I/O guidelines that specify the minimum and maximum operating voltage levels required for proper operation of the buffer circuit with other circuits. Such guidelines are generally derived from groups and/or agencies that set standards usable by the industry as a whole. There are many standards (e.g., LVTTL, LVCMOS, SSTL, HSTL, PCI, and PCI-X) for various interface applications. For example, low-voltage transistor-transistor logic (LVTTL) requires a 1.8V, 2.5V, or 3.3V input voltage levels depending on the needs of a given circuit application.

Integrated circuits and electrical components are usually designed with operating margins to allow them to operate somewhat outside their intended operating parameters without permanent damage. For example, most buffer circuit designs allow a buffer circuit to sustain momentary fluctuations in voltage and current beyond their operational specifications without incurring damage that can lead to permanent performance degradation. Unfortunately, as integrated circuit manufacturers shrink the size of the integrated circuits through the use of more advanced silicon processes, many of the once robust circuits are now becoming susceptible to damage and permanent degradation. To meet industry form, fit, and function requirements, such smaller less robust integrated circuits are usually specified in, and expected to operate in environments previously supported by the larger more robust integrated circuits. For example, a buffer circuit originally designed to accommodate 3.3V with built-in operating margins may begin having failures caused in part by decreasing operating margins due to the smaller, thinner oxide and shorter transistor channel components. The problem is further exacerbated when designing an integrated circuit using a more advanced silicon process, due to the fact that the advanced silicon process may no longer offer the higher voltage tolerant transistors, previously available with less advanced silicon processes.

One operating concern for transistors is handling momentary voltage and current transitions that may exceed their specified ratings without permanent degradation. For example, some transistor degradation mechanisms like Hot Carrier Injection (HCI) and Negative Bias Temperature Instability (NBTI) degrade the gate oxide of the transistor and serve to reduce its performance by increasing the threshold voltage as well as reducing the drive capability of the transistor. HCI is a transistor degradation mechanism which primarily afflicts the NMOS transistors of the circuit. It is caused due to the injection of hot electrons into the gate of the transistor causing charge trapping in the gate oxide and hence degradation in performance. Hot carriers are the results of high energy electrons which form the drain current as well as the electron-hole pairs generated at the drain end due to impact ionization. These degradation mechanisms become even more evident with decreasing transistor gate size.

There is therefore a need for circuits and methods to reduce the electrical stress imposed on integrated circuit transistors in order to improve integrated circuit operational performance and robustness. There is also a need for circuits and methods to support a higher voltage operation than the devices derived from a given silicon process are specified for, without permanent degradation.

SUMMARY

In one embodiment, a buffer circuit includes a preconditioning circuit and a driver circuit. The preconditioning circuit is adapted to generate an output signal at a first voltage level in response to an input signal. The driver circuit is adapted to generate an output signal at a second voltage level. The voltage output of the preconditioning circuit is applied to the output of the driver circuit to reduce the VDS of at least some of the transistors used to provide the output signal of the driver circuit. The lower VDS results in a reduced HCI. The buffer circuit combines the output signal of the preconditioning circuit and the output signal of the driver circuit to form a composite output signal.

In another embodiment, a buffer circuit includes a first output driver circuit and a second output driver circuit. The second output driver circuit is coupled to a delay circuit. The first output driver circuit generates an output signal at a first voltage level in response to an input signal. The output signal of the first output driver circuit is coupled to an output of the second output driver circuit. The output signal of the first output driver circuit is used to provide an offset voltage to the output of the second output driver circuit. The voltage offset is used to offset the biasing across the driver transistors sufficiently to reduce the VDS of at least some transistors employed by the second output driver circuit. After a predetermined delay, the second output driver circuit generates an output signal at a second voltage level in response to the input signal. The buffer circuit combines the output signal of the first output driver circuit and the output signal of the second output driver circuit to form a composite output signal.

In another embodiment, the present invention provides a method of pre-charging a buffer circuit. The method includes generating an output voltage from a first output driver circuit in response to an signal input to the first output driver circuit, applying the output signal of the first output driver to an output of a second output driver to reduce the VDS of transistors employed by the second output driver, generating a voltage output from the second output driver in response to the input signal coupled to the second output driver, and combining the voltage output of the first output driver circuit and the voltage output of the second output driver circuit to form a composite output signal of the buffer circuit.

In another embodiment, the present invention provides a method of discharging a buffer circuit. The method includes generating an output voltage from a first output driver circuit in response to an signal input to the first output driver circuit, applying the output signal of the first output driver to an output of a second output driver to reduce the VDS of transistors employed by the second output driver, generating a voltage output from the second output driver in response to the input signal coupled to the second output driver, combining the voltage output of the first output driver circuit and the voltage output of the second output driver circuit to form a composite output signal of the buffer circuit. When the input signal to the first output driver circuit is set to an OFF state, the method includes reducing the composite output signal voltage by the output voltage level of the first output driver circuit. When the input signal to the second output driver circuit is set to an OFF state, the voltage level of the output is further discharged to a base voltage level.

A better understanding of the nature and advantages of the present invention may be gained with reference to the following detailed description and the accompanying drawings.

DESCRIPTION OF EXEMPLARY EMBODIMENTS

The present invention pertains to circuits and methods for precharging and discharging buffer circuits using output signal preconditioning resources to reduce electrical stress and degradation associated with the buffer circuit driver transistors. Generally, transistor performance degradation is caused by electrical or thermal stress. For example, electrical stress is caused by Hot Carrier Injection (HCI) which degrades transistor performance. HCI is caused by excessive drain-to-source voltage (VDS), which degrades the gate of the transistor, and serves to reduce transistor performance by increasing the threshold voltage as well as reducing the drive capability of the transistor. In one embodiment, a preconditioning circuit is used in parallel with a buffer driver circuit to precharge or discharge the drive transistors of the buffer driver circuit to a first voltage level to reduce VDS across the drive transistors, thereby protecting the transistors from degradation due to HCI. In another embodiment, during precharging, a voltage comparison circuit, in response to the input signal and the output voltage of the preconditioning circuit, is used to control when an input signal is passed to the buffer driver circuit to complete the voltage transition at the output of the buffer circuit to a second voltage level.

While the invention is described herein in the context of various single-ended input buffer circuits, those skilled in the art will appreciate that the techniques described herein can be applied to differential buffer circuits as well as to any other circuitry that can benefit from precharging and discharging an input/output (I/O) signal to reduce HCI.

Figure 1:
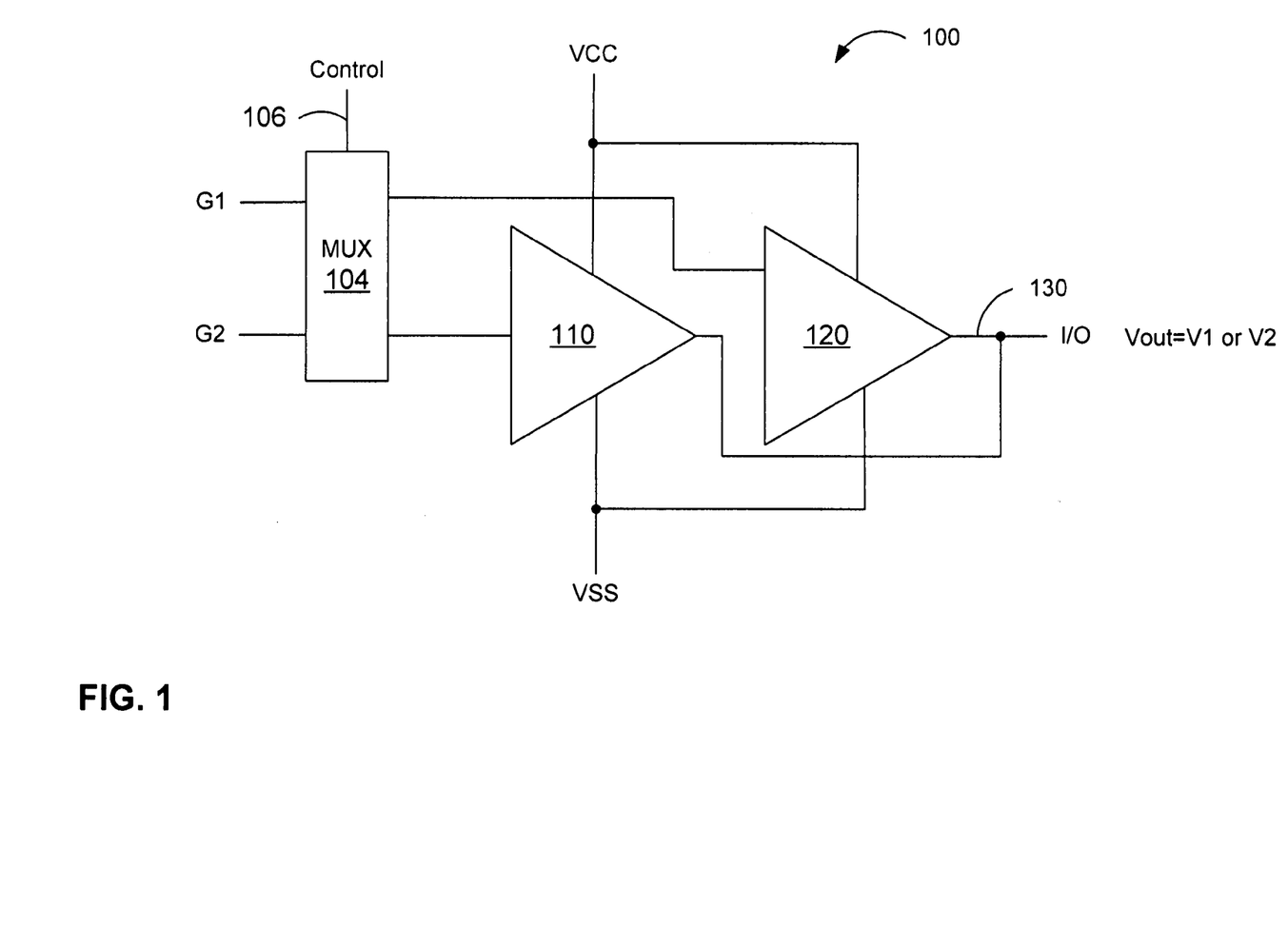
FIG. 1 is a simplified circuit diagram of one exemplary embodiment of a buffer circuit according to an exemplary embodiment of the present invention.

FIG. 1 is a simplified circuit diagram of one exemplary embodiment of a buffer circuit 100. Buffer circuit 100 includes driver circuit 110, preconditioning circuit 120, and multiplexer circuit 104. Driver circuit 110 and preconditioning circuit 120 may be biased using any number of conventional biasing techniques. For example, as illustrated, driver circuit 110 and preconditioning circuit 120 may be coupled to VCC and VSS (e.g. ground) for operation. During operation, preconditioning circuit 120 receives a signal G1 on an input, via multiplexer 104, and generates an I/O signal 130 voltage level of Vout=V1 in response to signal G1. Driver circuit 110 receives on an input, via multiplexer 104, a delayed version of the input signal G1 as signal G2. Signal G2 enables driver circuit 110 to drive I/O signal 130 to a voltage level V2. An output signal of driver circuit 120 is coupled to the output of preconditioning circuit 120 to generate a final I/O signal 130 voltage level of Vout=V2. Therefore, I/O signal 130 (e.g., the output waveform) is generated by a combination of control signal G1 and signal G2 input to preconditioning circuit 120 and driver circuit 110, respectively.

Multiplexer 104 is an optional circuit that is responsive to control signal 106. Multiplexer 104 controls the coupling of signal G1 and signal G2 to the inputs of preconditioning circuit 120 and driver circuit 110, respectively. Advantageously, multiplexer 104 allows a user to programmably control which signal G1 or G2 is to be coupled to the preconditioning circuit 120 and driver circuit 110 for the needs of a given application. For example, in order to test driver circuit 110, a user may set multiplexer 104 to allow signal G2 to pass to driver circuit 110 and not allow signal G1 to pass to preconditioning circuit 120. Alternatively, in order to test preconditioning circuit 110, a user may set multiplexer 104 to allow signal G1 to pass to preconditioning circuit 120 and not allow signal G2 to pass to driver circuit 110. In another embodiment, multiplexer 104 may be set such that only signal G2 to pass to driver circuit 110, thereby enabling driver circuit 110 to operate as a conventional driver circuit without pre-charge or discharge.

In one embodiment, during pre-charge, signal G1 and signal G2 are the same input signal delayed by a predetermined amount of time $T_{delay}$. For example, signal G1 arrives to an input of preconditioning circuit 120 at time T, which is before signal G2 arrives to an input of driver circuit 110 at time $T_1$ (i.e., $T_{delay}=T_1-T$). In this embodiment, at time T, in response to signal G1, preconditioning circuit 120 drives I/O signal 130 to voltage level V1. Voltage level V1 may be set to a number of different values depending on the needs of a given circuit operational criteria. For example, for a 3.3V system, I/O signal 130 may be set to a voltage V1 of 0.7V, which is lower than the turn on threshold value for 3.3V systems. In one embodiment, during $T_{delay}$ (e.g., before driver circuit 110 amplifies signal G2), voltage V1 is used to reduce the VDS of the output transistors with respect to VCC and VSS, as will be described below. At time T1, driver circuit receives signal G2 and outputs V2. Therefore, during time T0 to T1, Vout changes from V1 to V2. Similar to voltage level V1 in a 3.3V system, V2 is within a turn-on threshold of the 3.3V system.

Figure 2:
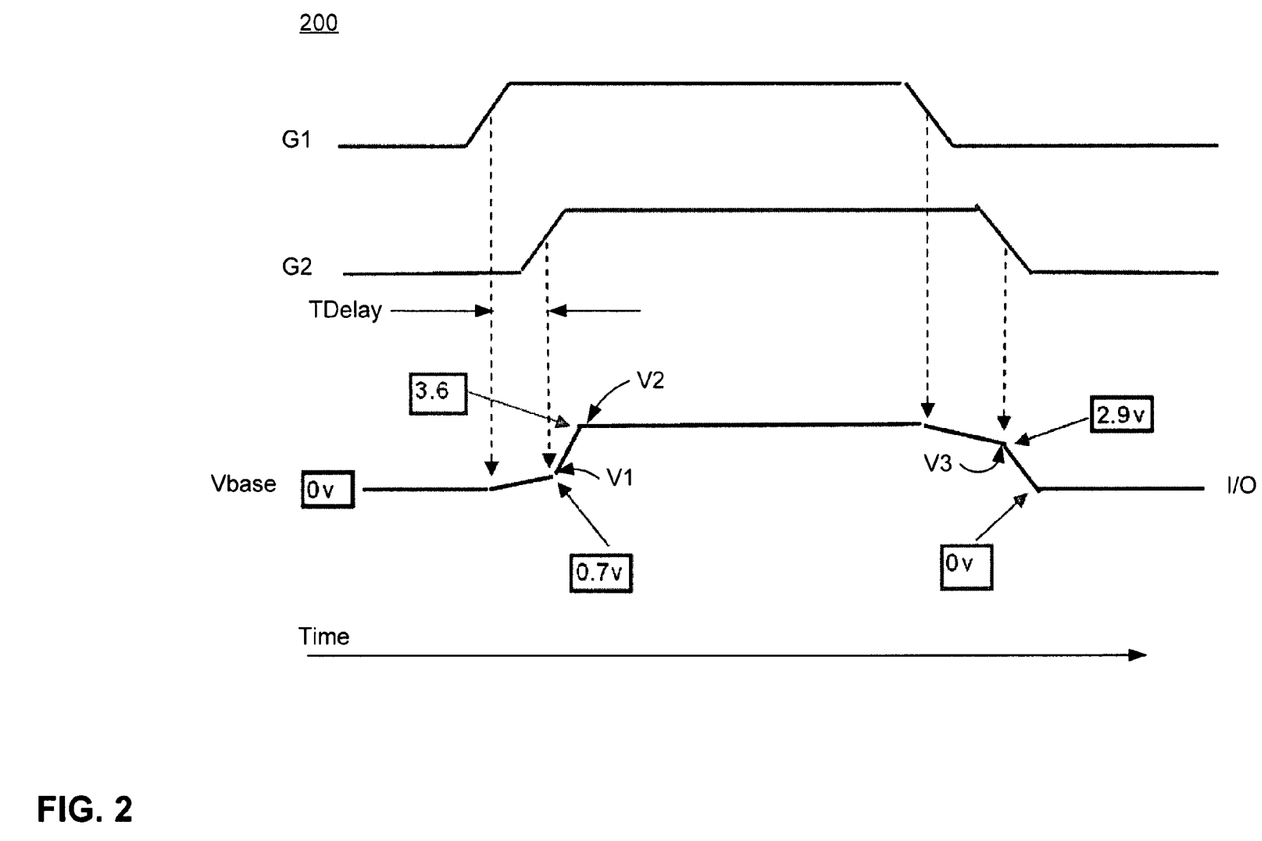
FIG. 2 is an illustration of an input signal waveform, preconditioning signal waveform, and output signal waveform according to an exemplary embodiment of the present invention.

For example, FIG. 2 illustrates a signal waveform timing diagram 200 including input signal G1, delay signal G2, and I/O signal 130. As illustrated in FIG. 2, in response to signal G1, during a pre-charge condition, preconditioning circuit 120 increases Vbase to V1 (e.g., 0.0V to 0.7V), or some desired voltage therebetween. After a predetermined delay, $T_{delay}$, and/or voltage level as will be described below, driver circuit 110 is activated by signal G2. In response to signal G2, driver circuit 120 increases I/O signal 130 from V1 to V2 (e.g., 0.7V to 3.6V). This multi-step voltage transition is advantageous as it lowers the VDS of driver circuit by at least voltage level V1, thereby reducing HCI.

Figure 3:
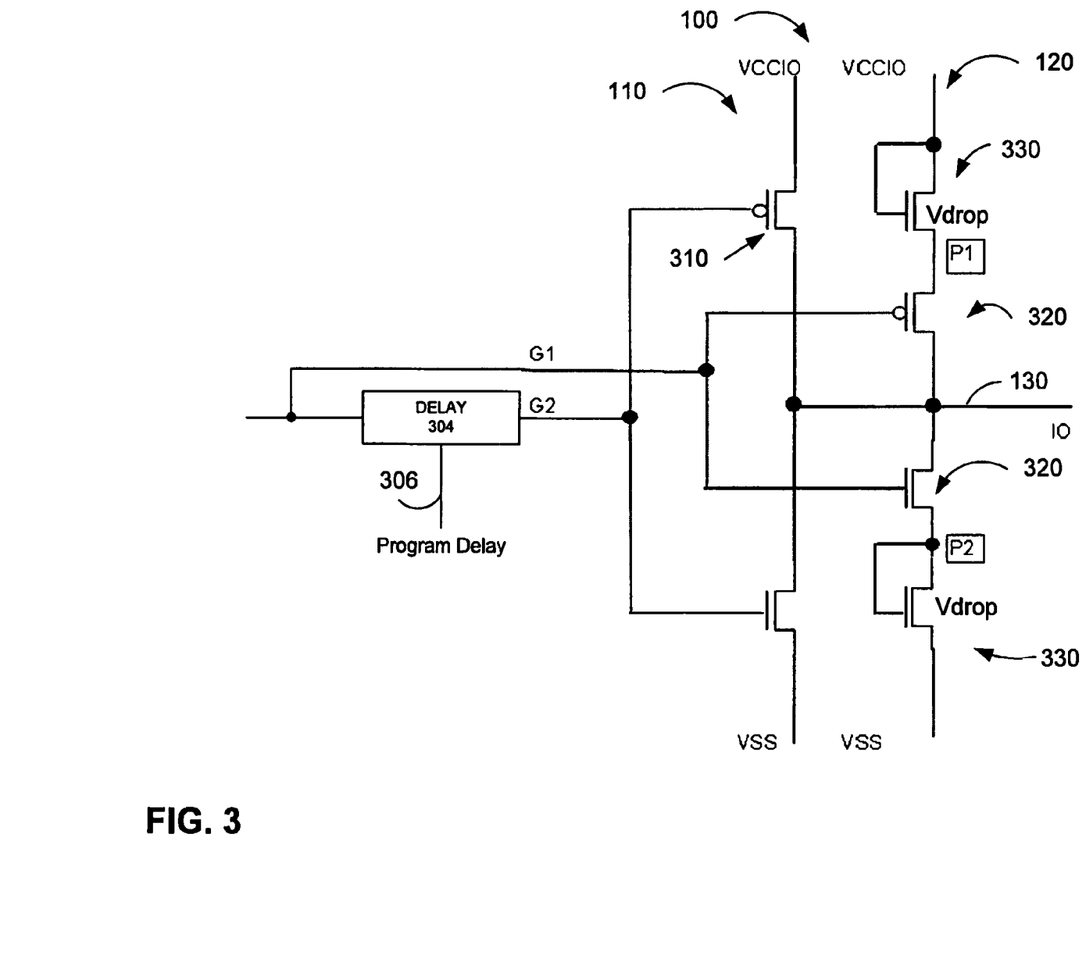
FIG. 3 is a simplified circuit diagram of a buffer with preconditioning circuit according to an exemplary embodiment of the present invention.

FIG. 3 is a simplified circuit diagram of buffer circuit 100 with a driver circuit 110, preconditioning circuit 120, and delay circuit 304. In one embodiment, preconditioning circuit 120 includes a pair of transistors 320 coupled in series to transistors 330 adapted to generate a voltage drop between VCC and I/O signal 130. Transistors 320 are illustrated as a pair of NMOS and PMOS transistors in series between VCC and VSS having a common node to generate I/O signal 130. Transistors 320 are activated by signal G1 input to their gates. When activated, transistors 320 increase I/O signal 130 to voltage level V1, relative the voltage drop developed by transistors 330 as described below. While transistors 320 are illustrated as a pair of transistors, virtually any combination of transistors and electrical components may be used to provide I/O signal 130.

In one embodiment, transistors 330 include one or more voltage-drop elements such as diode-connected MOS transistors. For example, transistors 330 may include diode-connected MOS transistors such that when biased, transistors 330 develop voltage drops P1 and P2 in series with VCC and VSS, respectively. Transistors 330 use voltage drop P1 and P2 from VCC/VSS to generate the V1 level of I/O signal 130. For example, transistors 330 may be set for a voltage drop P1 and P2 sufficient such that, for a G1 signal level sufficient to turn on transistors 320, V1 is set to 0.7V. While, diode-connected transistors are illustrated, it is contemplated that transistors 330 may be replaced by virtually any electrical element or circuit that is capable of providing a voltage drop. For example, transistors 330 may be replaced by a voltage drop circuit that includes resistors, diodes, or other electrical components that may be used to advantage.

Driver circuit 110 includes a pair of driver transistors 310 coupled in series. In one embodiment, driver transistors 310 are coupled in parallel to preconditioning circuit 120 such that they share a common bias VCC and VSS, and I/O signal 130. While illustrated as sharing a common bias, it is contemplated that driver circuit 110 and preconditioning circuit 120 may be biased with different power supplies. Driver transistors 310 are activated and deactivated by signal G2 input to their gates. When activated, drive transistors 310 increase I/O signal 130 level from V1 to V2 (or a desired voltage level therebetween) as illustrated in FIG. 2.

In one embodiment, signal G2 may be a version of signal G1 that is delayed by delay circuit 304. Delay circuit 304 receives signal G2 after $T_{delay}$ in order to provide time for preconditioning circuit 120 to establish V1, or portion thereof. Delay circuit 304 may be preset or controlled by program delay signal 306. In one embodiment, delay signal 306 may be employed to control delay circuit 304 to control the propagation of signal G1 though delay circuit 304, and/or program $T_{delay}$ for the needs of a given application.

Referring to FIG. 2 and FIG. 3, during a discharge condition, when G1 is set to an OFF condition, I/O signal 130 is discharged to voltage level V3, where V3=V2−V1. Voltage level V3 may be a value that is within the ON state of the I/O signal 130. For example, where voltage level V2 is 3.6 V, V3 may be set to 2.9V=3.6V-0.7V. When G2 is set to an OFF condition, I/O signal 130 is further discharged to Vbase. As during the pre-charge condition, this multi-step voltage transition "softens" the voltage transitions and lowers the VDS of driver circuit by at least voltage level V1 to reduce HCI.

In one embodiment, VDS may be calculated as a function of Vbias and voltage level V1. VDS is offset by voltage level V1 using the following equation:

$$VDS = Vbias - V1 \qquad \text{(Equation 1)}$$

where Vbias is either VCC or VSS depending on whether the transistors are an NMOS or PMOS transistor. As HCI is reduced with respect to VDS, equation 1 shows that VDS is reduced by V1, thereby reducing HCI.

Figure 4:
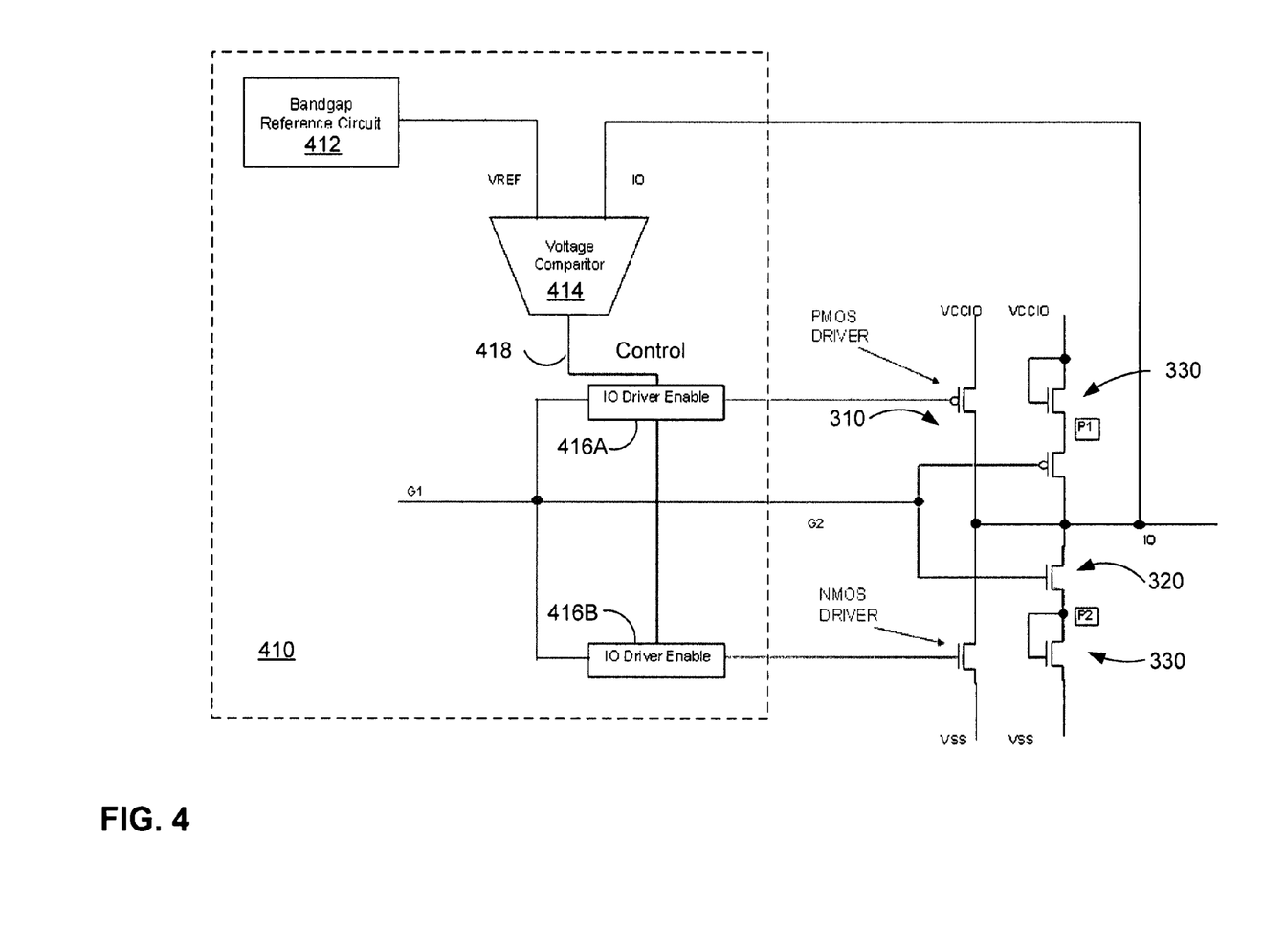
FIG. 4 is a simplified circuit diagram of a buffer circuit with a preconditioning circuit and a signal gating circuit according to an exemplary embodiment of the present invention.

FIG. 4 is a simplified circuit diagram of a buffer circuit 100 with preconditioning circuit 120 and a signal gating circuit 410. In one embodiment, signal gating circuit 410 includes a voltage comparator 414, voltage reference circuit 412, and I/O driver enable circuits 416A and 416B. In one embodiment, voltage comparator 414 has an input coupled to I/O signal 130 and an input coupled to an output of voltage reference 412. Voltage comparator 414 generates a bias signal output in response to the signal comparison between I/O signal 130 and an output bias of voltage reference 412.

Inputs of I/O driver enable circuits 416A and 416B are coupled to signal G1. Outputs of I/O driver enable circuits 416A and 416B are coupled to inputs of driver circuit 110. In this embodiment, I/O drivers 416A-B control the propagation of signal G1 to the inputs of driver circuit 110. In providing such propagation control, I/O drivers 416A-B may be used to control when signal G1 is used to activate driver circuit 110 and therefore control the voltage output to the output of the buffer circuit 100. I/O driver enable circuits 416A-B may be formed of any number of circuits such as delay circuits, flip-flop circuits, timing circuits, delay-locked loops, and the like.

In one embodiment, I/O driver enable circuits 416A-B include a control input 418 coupled to an output of voltage comparator 414. In response to a bias signal on control input 418, I/O driver circuits 416A-B control the propagation of signal G1 (e.g., gate signal G1). For example, when control input 418 is biased to an ON state, signal G1 is allowed to propagate through I/O enable driver 416 to driver transistors 310. When control input 418 is biased to an OFF state, signal G1 is prevented from propagating through I/O enable drivers 416A-B to driver transistors 310.

While control input 418 is illustrated controlled by comparator 414, it is contemplated that control input 418 may be progammably controlled by a processor, and the like, to set a desired amount of delay, or to programmably inhibit signal G1 from being coupled to driver circuit 110. This is advantageous as it allows the voltage level V1 of the preconditioning circuit 120 to be independently tested and characterized for the needs of a given application.

Referring to FIG. 2 and FIG. 4, in one pre-charging condition, where Vref=V1, when I/O signal 130 less than Vref, voltage comparator 414 provides an OFF signal to control input 418 to prevent signal G1 from being coupled to driver circuit 110. In another pre-charging condition, when signal G2 increases I/O signal 130 to voltage level V1, or greater, and Vref=V1, voltage comparator 414 provides an ON signal to control input 418, to allow signal G1 to pass to inputs of driver circuit 110.

In another embodiment, during a discharging condition, when signal G1 goes to an OFF state, I/O signal 130 discharges from voltage level V2 to voltage level V3. In this illustration, when V3 is less than Vref, voltage comparator 414 provides an OFF signal to control input 418. When G2 transitions to an OFF state, I/O signal 130 is discharged from V1 to Vbase (e.g., zero volts). This discharging process allows driver transistors 310 to experience a "soft" transition between V2 and Vbase. Such a "soft" transition may be used to reduce electrical stress on the driver transistors 310.

Figure 5:
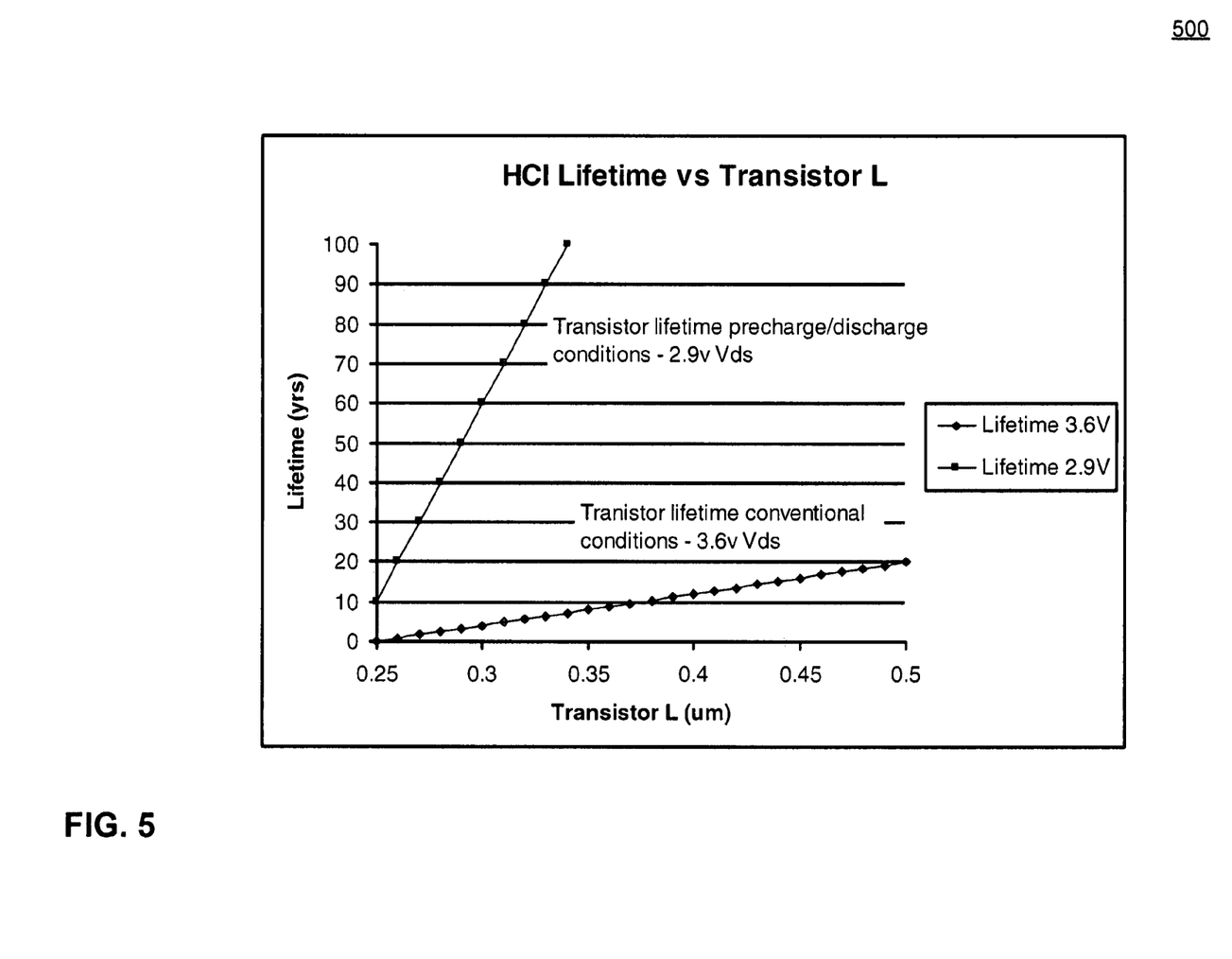
FIG. 5 is an illustration of a NMOS transistor lifetime performance chart according to an exemplary embodiment of the present invention.

In one embodiment, the affect of VDS on transistor life, as described herein, may be illustrated in a chart. For example, FIG. 5 is an illustration of a transistor lifetime performance chart versus VDS. As illustrated, a transistor's life in years with respect to gate length and VDS is plotted as lifetime data plot 502 with respect to a VDS of 3.6V. A transistor's life in years with respect to gate length and VDS achieved using embodiments of the present invention is plotted as lifetime data plot 504 with respect to a VDS of 2.9V.

Figure 6:
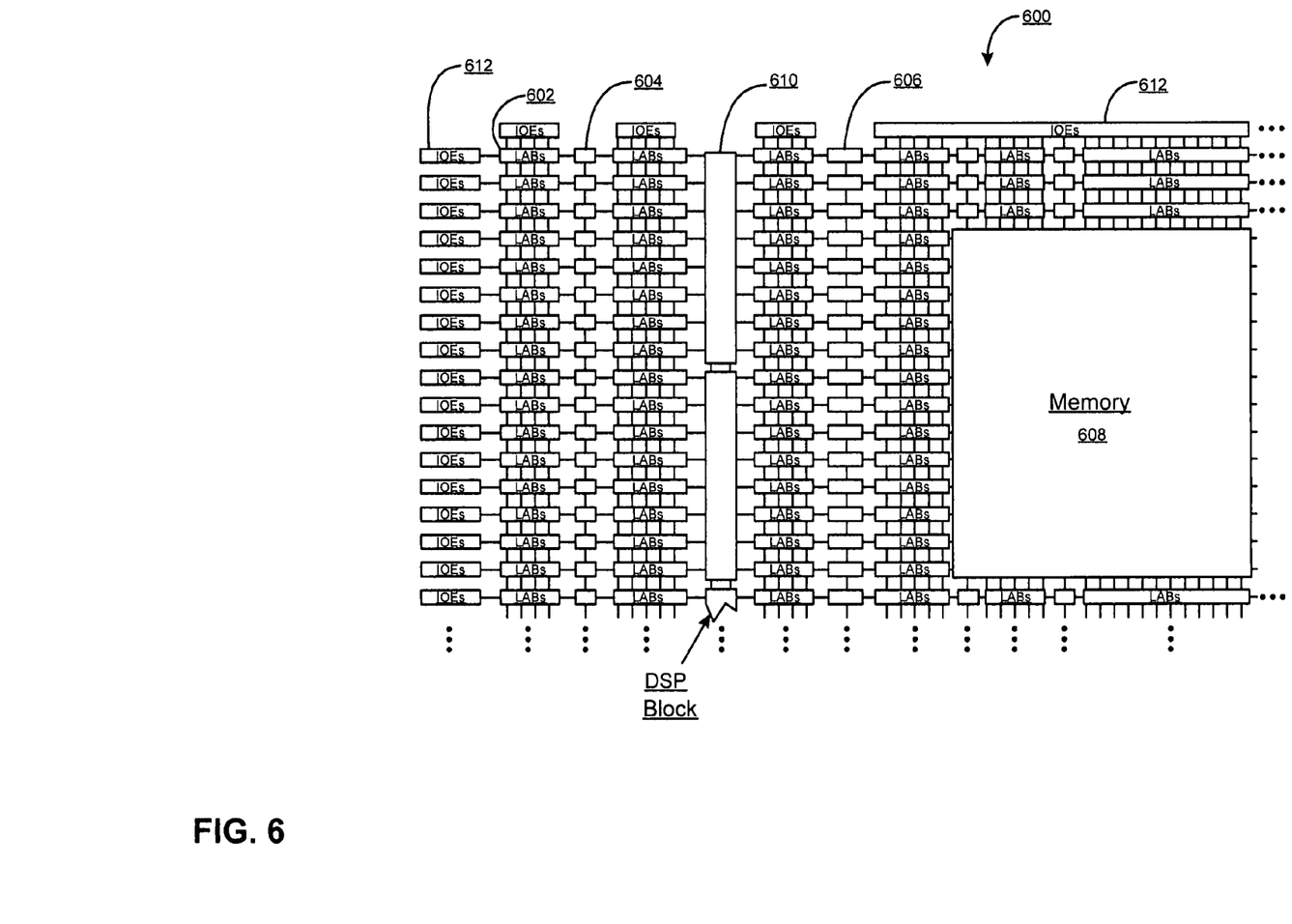
FIG. 6 is a simplified block diagram of a programmable logic device that can embody the techniques of the present invention.

FIG. 6 is a simplified partial block diagram of one example of PLD 600 that can implement aspects of the present invention. It should be understood that the present invention can be applied to numerous types of integrated circuits including programmable logic integrated circuits, field programmable gate arrays, mask FPGAs, and application specific integrated circuits (ASICs) or application specific standard products (ASSPs) that provide programmable resources. Referring to FIG. 6, PLD 600 includes a two-dimensional array of programmable logic array blocks (or LABs) 602 that are interconnected by a network of column and row interconnects of varying length and speed. LABs 602 include multiple (e.g., 10) logic elements (or LEs).

An LE is a programmable logic block that provides for efficient implementation of user defined logic functions. A PLD has numerous logic elements that can be configured to implement various combinatorial and sequential functions. The logic elements have access to a programmable interconnect structure. The programmable interconnect structure can be programmed to interconnect the logic elements in almost any desired configuration.

PLD 600 also includes a distributed memory structure including RAM blocks of varying sizes provided throughout the array. The RAM blocks include, for example, 512 bit blocks 604, 4K blocks 606, and a block 608 providing 512K bits of RAM. These memory blocks can also include shift registers and FIFO buffers.

PLD 600 further includes digital signal processing (DSP) blocks 610 that can implement, for example, multipliers with add or subtract features. I/O elements (IOEs) 612 located, in this example, around the periphery of the device support numerous single-ended and differential I/O standards. These I/O elements 612 may include differential input or output buffers with preconditioning circuitry of the type shown in FIGS. 1-4. PLD 600 can additionally provide transceiver functionality for telecommunication applications. In the exemplary embodiment shown in FIG. 6, PLD 600 includes one or more transceiver blocks 620. Transceiver blocks 620 may include buffer circuit 100 of FIG. 1 and may implement pre-charge/discharge techniques as described herein to lower VDS and therefore lower transistor degradation due to HCI. It is to be understood that PLD 600 is described herein for illustrative purposes only and that the present invention can be implemented in many different types of PLDs, FPGAs, and the like.

Figure 7:
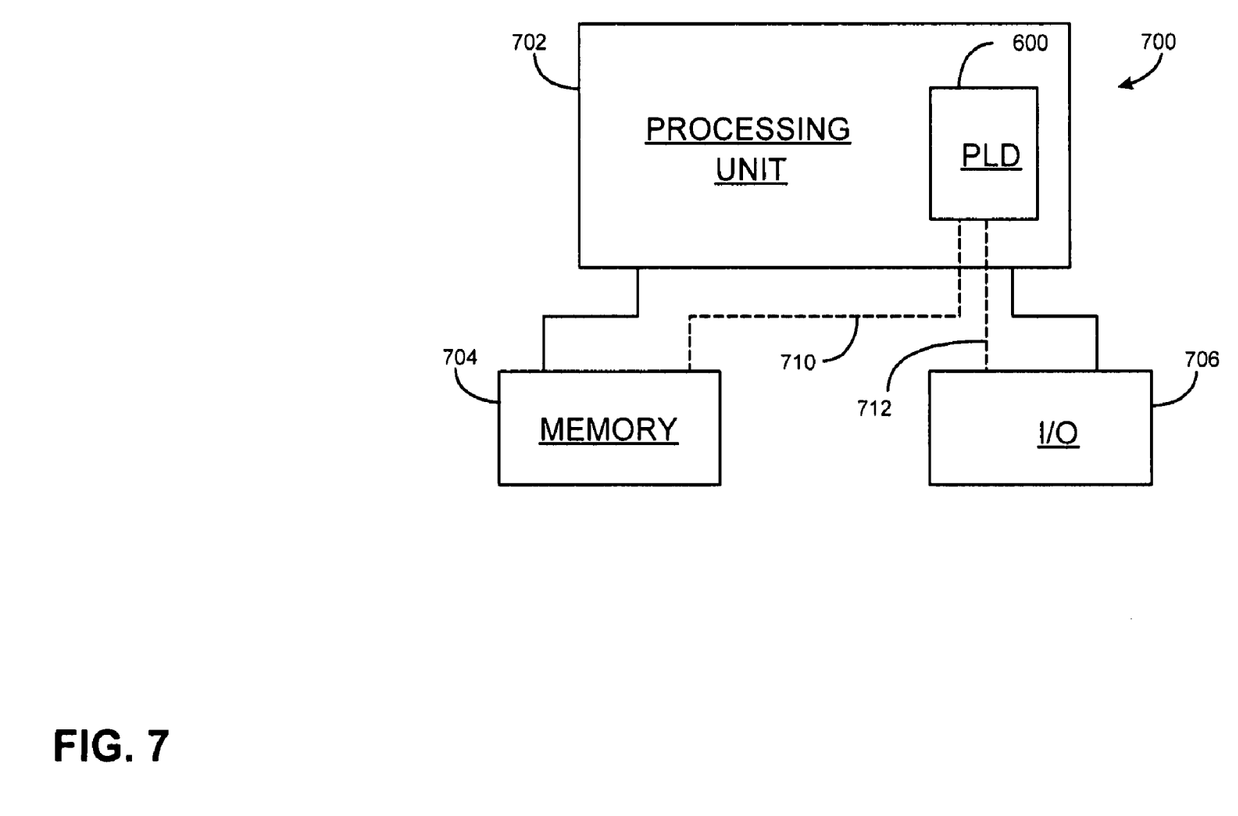
FIG. 7 is a block diagram of an electronic system that can implement embodiments of the present invention.

While PLDs of the type shown in FIG. 6 provide many of the resources required to implement system level solutions, the present invention can also benefit systems wherein a PLD is one of several components. FIG. 7 shows a block diagram of an exemplary digital system 700, within which the present invention can be embodied. System 700 can be a programmed digital computer system, digital signal processing system, specialized digital switching network, or other processing system. Moreover, such systems can be designed for a wide variety of applications such as telecommunications systems, automotive systems, control systems, consumer electronics, personal computers, Internet communications and networking, and others. Further, system 700 can be provided on a single board, on multiple boards, or within multiple enclosures.

System 700 includes a processing unit 702, a memory unit 704 and an I/O unit 706 interconnected together by one or more buses. According to this exemplary embodiment, a PLD 600 is embedded in processing unit 702. PLD 600 can serve many different purposes within the system in FIG. 7. PLD 600 can, for example, be a logical building block of processing unit 702, supporting its internal and external operations. PLD 600 is programmed to implement the logical functions necessary to carry on its particular role in system operation. PLD 600 can be specially coupled to memory 704 through connection 710 and to I/O unit 706 through connection 712.

Processing unit 702 can direct data to an appropriate system component for processing or storage, execute a program stored in memory 704 or receive and transmit data via I/O unit 706, or other similar function. Processing unit 702 can be a central processing unit (CPU), microprocessor, floating point coprocessor, graphics coprocessor, hardware controller, microcontroller, programmable logic device programmed for use as a controller, network controller, and the like. Furthermore, in many embodiments, there is often no need for a CPU.

For example, instead of a CPU, one or more PLDs 600 can control the logical operations of the system. In an embodiment, PLD 600 acts as a reconfigurable processor, which can be reprogrammed as needed to handle a particular computing task. Alternately, programmable logic device 600 can itself include an embedded microprocessor. Memory unit 704 can be a random access memory (RAM), read only memory (ROM), fixed or flexible disk media, PC Card flash disk memory, tape, or any other storage means, or any combination of these storage means.

Figure 8:
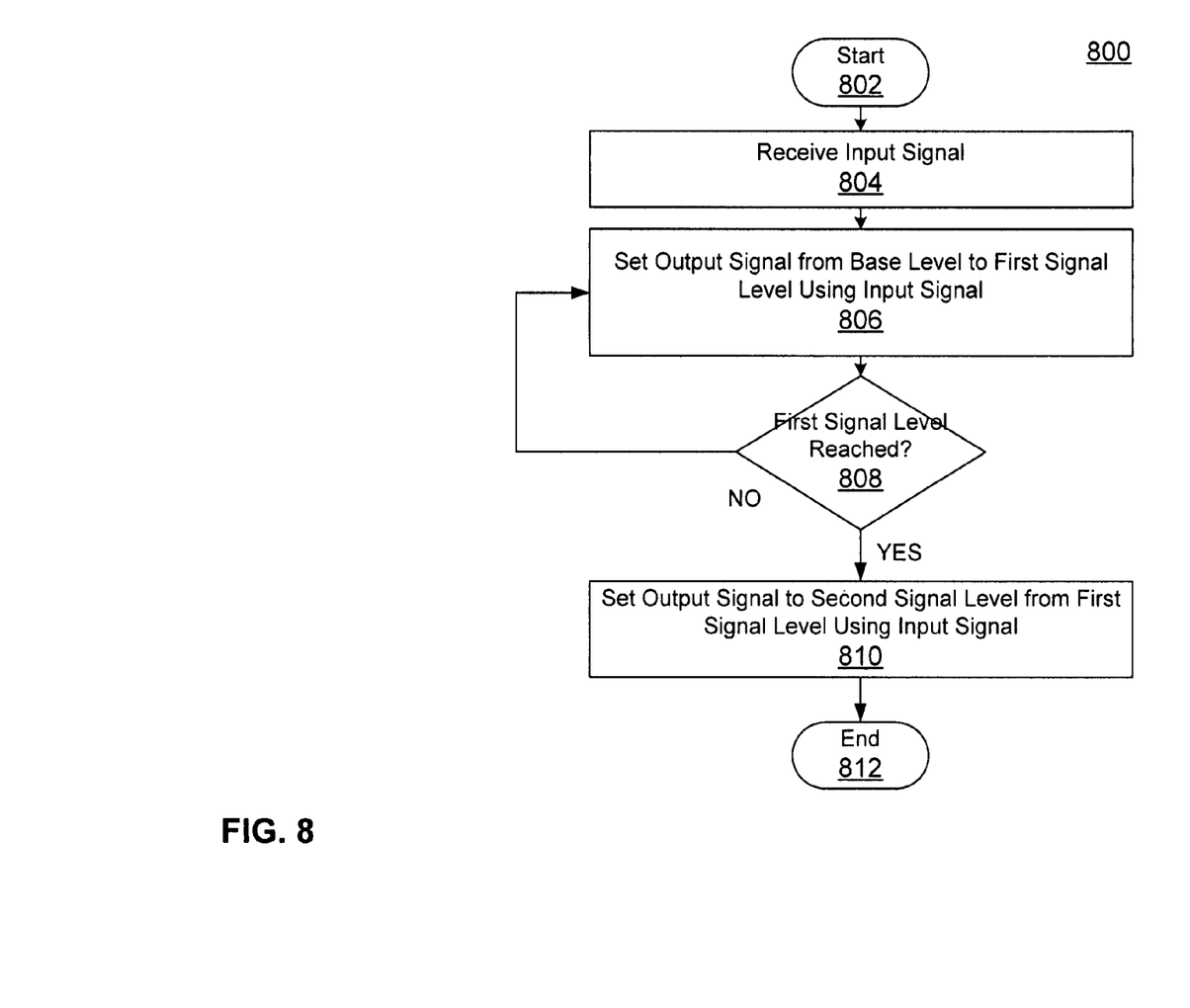
FIG. 8 is a flow diagram for a method of precharging a buffer circuit according to an exemplary embodiment of the present invention.

FIG. 8 is a flow diagram of a method 800 of pre-charging buffer circuit 100 to lower HCI. Referring to FIGS. 1-4, and FIG. 8, Method 800 may be entered into at step 802 by employing buffer circuit 100 to buffer a signal, such as signal G1. At step 804, input signal G1 is received. At step 806, a first voltage level V1 is generated on the I/O signal 130 in response to signal G1. For example, voltage level V1 may be 0.7V. The voltage level V1 is employed to reduce the VDS of drive transistors 310. If after the voltage level V1 has been reached, or portion thereof, and/or a particular time delay threshold has lapsed, the input signal G1 is presented to the buffer circuit 100 as input signal G2 at step 810. Signal G2 establishes voltage level V2, starting from the first level, V1. In this embodiment, the voltage level V2 may be the desired operating voltage limit such as 3.6V. In this embodiment, VDS is lowered by the voltage of V1, thereby decreasing HCI.

Figure 9:
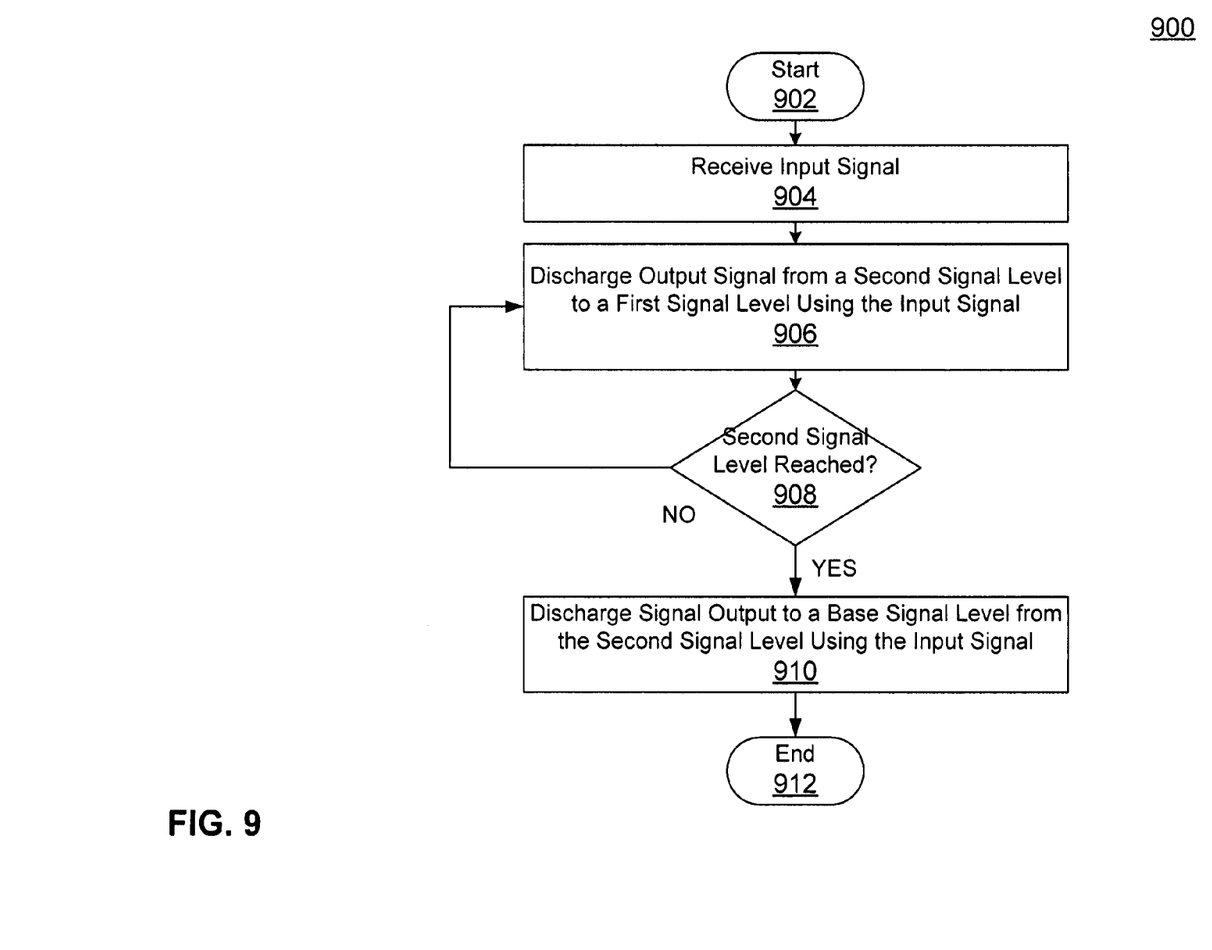
FIG. 9 is a flow diagram for a method of discharging a buffer circuit according to an exemplary embodiment of the present invention.

FIG. 9 is a flow diagram of a method 900 of discharging buffer circuit 100. Referring to FIGS. 1-4, and FIG. 9, Method 900 may be entered into at step 902 by employing buffer circuit 100 to buffer signals, such as input signals G1 and G2. At step 904, input signal G1 and G2 are received setting the I/O output 130 to V2. At step 906, a third voltage level V3 is generated on the I/O signal 130 in response to signals G2 and the change of signal G1 to an OFF state. For example, where voltage level V2 is 3.6V and voltage level V1 is 0.7V, voltage level V3 may be 2.9V. If after the voltage level V3 has been reached, or portion thereof, and/or a particular time delay threshold has lapsed, the state of input signal G2 is changed to OFF at step 910. Changing the state of signal G2 to OFF allows I/O output 130 to discharge voltage level V3 to voltage level Vbase. In this embodiment, VDS is lowered by the "soft" transition of voltage level V2 to voltage level V3, and eventually the transition of voltage level V3 to voltage Vbase, thereby reducing the electrical stress on the buffer circuit 100.

The present invention thus provides various techniques for reducing HCI in buffer circuits that may be enabled by programmable logic. While the above provides a detailed description of various embodiments of the invention, many alternatives, modifications, and equivalents are possible. Therefore the scope of this invention should not be limited by the specific embodiments described above, and should instead be determined with reference to the appended claims along with their full scope of equivalents.

What is claimed is:

1. A method of pre-charging a buffer circuit, the method comprising:

generating a first output signal from a first transistor in response to an input signal, wherein the output signal from the first transistor is coupled to an output of the buffer circuit, thereby causing the output of the buffer circuit to change from a first voltage to a predetermined voltage threshold;

when the predetermined voltage threshold at the output of the buffer circuit has been reached:

applying the input signal to an input of a second transistor to generate a second output signal of the second transistor; and continuing to generate the first output signal from the first transistor while generating the second output signal from the second transistor, wherein the output of the second transistor is coupled to the output of the buffer circuit; and combining the first output signal generated from the first transistor and the second output signal generated from the second transistor to generate a composite output signal of the buffer circuit.

2. The method of claim 1, wherein the output signal of the first transistor reduces the drain-to-source voltage of the second transistor.

3. The method of claim 1, wherein when the buffer circuit output is at an OFF state, the voltage level of the output signal of the first transistor is less than an OFF state voltage level threshold of the OFF state.

4. The method of claim 1, wherein when the output signal of the buffer circuit is set to an ON state by the composite output signal, the voltage level of the composite output signal is greater than an ON state voltage level threshold of the ON state.

5. The method of claim 1 wherein the output signal of the first transistor has a first voltage magnitude, the output signal from the second transistor has a second voltage magnitude, and the first voltage magnitude is less than the second voltage magnitude.

6. The method of claim 1, wherein the output of the buffer circuit crosses the predetermined voltage threshold as the voltage at the output of the buffer circuit changes from the first voltage to another voltage.

7. A method of discharging a buffer circuit to create an output signal transmitted to a system, the method comprising:

generating a first output signal of a first transistor in response to an input signal;

after the first output signal of the first transistor reaches a first predetermined threshold, applying the input signal to an input of a second transistor to generate a second output signal of the second transistor, wherein the first predetermined threshold sets a delay between when the input signal is received by an input of the first transistor and when the input signal is received by the input of the second transistor; and generating an output signal of the buffer circuit by combining the first output signal of the first transistor and the second output signal of the second transistor, wherein the first transistor has an input connected to a first voltage from which the first output signal is generated, and wherein the second transistor has an input connected to a second voltage from which the second output signal is generated, wherein the second voltage is larger than the first voltage, and wherein the first voltage is lower than a turn on threshold of the system to which the output signal is transmitted.

8. The method of claim 7, further comprising when a second predetermined threshold has been reached, reducing the output signal of the buffer circuit to a base voltage level.

9. The method of claim 7 wherein the first transistor is coupled to drive the output signal of the buffer circuit to a first voltage and the second transistor is coupled to drive the output signal of the buffer circuit to a second voltage, the first voltage less than the second voltage.

10. The method of claim 7, further comprising:

continuing to generate the first output signal from the first transistor while generating the second output signal from the second transistor.

11. A signal buffering circuit, comprising:

a first output driver circuit that generates a first output signal having a first magnitude in response to an input signal;

a second output driver circuit that generates a second output signal having a second magnitude, wherein the first output signal generated by the first output driver circuit is combined with the second output generated by the second output driver circuit to form a composite output signal of the signal buffering circuit;

a comparator that receives the composite output signal of the signal buffering circuit and that asserts a gating signal when the output signal of the signal buffering circuit reaches a first threshold; and a gating circuit that couples the input signal to the second output driver when the gating signal is asserted, wherein after the input signal is coupled to the second output driver, the first output driver circuit continues to generate the first output signal in response to the input signal while the second output driver generates the second output signal.

12. The circuit of claim 11, wherein the first output driver circuit comprises a voltage-drop circuit capable of providing a voltage drop from a bias voltage, wherein a voltage output of the first output driver circuit is the difference between the bias voltage and the voltage drop.

13. The circuit of claim 11, wherein the second output driver circuit comprises a transistor driver circuit capable of generating the output signal of the second output driver circuit in response to the gated input signal.

14. The signal buffering circuit of claim 11 wherein the second magnitude is larger than the first magnitude.

15. The signal buffering circuit of claim 14 wherein the first output driver circuit comprises a pull-up transistor in series with a first circuit element and a pull-down transistor in series with a second circuit element.

16. The signal buffering circuit of claim 15 wherein the first circuit element and the second circuit element are diode-connected MOSFET transistors.

17. The signal buffering circuit of claim 15 wherein the first circuit element and the second circuit element are resistors.

18. The signal buffering circuit of claim 14, wherein the first magnitude is lower than a turn on threshold of the signal buffering circuit.

19. A programmable logic device comprising a buffer circuit including:
- a first output driver circuit adapted to generate a first signal on an output of the first output driver circuit in response to an input signal, the first output driver connected to a first voltage source and second voltage source, wherein the first voltage source is greater than the second voltage source;
- a second output driver circuit adapted to generate a second signal on an output of the second output driver circuit in response to the input signal, wherein the first signal and second signal are combined to form a third signal; and
- a delay circuit having an output coupled with at least one input of the second output driver and programmably controlled by the programmable logic device, wherein the delay circuit establishes a delay between when the input signal is received by the first output driver circuit and when the input signal is received by the second output driver circuit,
- wherein the first output driver circuit comprises at least one voltage drop circuit adapted to generate the first signal with respect to a bias voltage used to bias the first output driver circuit, wherein a first voltage drop circuit is located between the output of the first output driver and the first voltage source, wherein the voltage after the voltage drop circuit is lower than a turn on threshold of the programmable logic device.

20. The programmable logic device of claim 19, wherein the second output driver circuit comprises at least one transistor adapted to generate the second signal.

21. The programmable logic device of claim 19, further comprising a driver enable circuit capable of coupling and decoupling the input signal to the second output driver circuit in response to control signals from the programmable logic device.

22. The programmable logic device of claim 19 wherein the first output driver comprises a pull-up transistor in series with a first circuit element and a pull-down transistor in series with a second circuit element, wherein the first circuit element and the second circuit element limit the output of the first output driver circuit.

23. The programmable logic device of claim 22 wherein the first circuit element and the second circuit element are diode-connected transistors.

24. The programmable logic device of claim 22 wherein the first circuit element and the second circuit element are diode-connected MOSFET transistors.

25. The programmable logic device of claim 22 wherein the first circuit element and the second circuit element are resistors.

26. The programmable logic device of claim 19, wherein the voltage after the voltage drop circuit is 0.7 V and the turn on threshold of the buffer circuit is between 0.7V and 3.3 V.

\* \* \* \* \*